(12) United States Patent
Kim et al.

(10) Patent No.: US 8,048,684 B2
(45) Date of Patent: Nov. 1, 2011

(54) STRUCTURE AND METHOD FOR MANIPULATING SPIN QUANTUM STATE THROUGH DIPOLE POLARIZATION SWITCHING

(75) Inventors: Hee Sang Kim, Seoul (KR); Nam Mee Kim, Seoul (KR)

(73) Assignees: Samsung Electronics Co., Ltd., Suwon-Si (KR); Seoul National University Industry Foundation, Seoul (KR)

(*) Notice: Subject to any disclaimer, the term of this patent is extended or adjusted under 35 U.S.C. 154(b) by 0 days.

(21) Appl. No.: 12/116,239

(22) Filed: May 7, 2008

(65) Prior Publication Data
US 2009/0085026 A1  Apr. 2, 2009

(30) Foreign Application Priority Data
Sep. 28, 2007  (KR) .................... 10-2007-0097733

(51) Int. Cl.
| H01L 21/00 | (2006.01) |
| H01L 29/00 | (2006.01) |
| H01L 29/02 | (2006.01) |
| H01L 29/04 | (2006.01) |
| H01L 29/06 | (2006.01) |
| H01L 29/10 | (2006.01) |
| H01L 29/12 | (2006.01) |
| H01L 31/00 | (2006.01) |
| H01L 47/00 | (2006.01) |
| G11C 11/22 | (2006.01) |

(52) U.S. Cl. ............. 438/3; 257/1; 257/2; 257/3; 257/4; 257/5; 257/12; 257/43; 365/145

(58) Field of Classification Search .............. 257/12; 438/3
See application file for complete search history.

(56) References Cited

U.S. PATENT DOCUMENTS
| 6,420,742 B1* | 7/2002 | Ahn et al. ............... 257/295 |
| 2004/0252737 A1* | 12/2004 | Yi et al. .................. 372/43 |
| 2008/0062615 A1* | 3/2008 | Rappe et al. ............ 361/321.5 |

OTHER PUBLICATIONS

Lasley-Hunter et al., J. Appl. Physics, v. 99, issue 8, Apr. 2006, abstract.*
Li et al. in "Spin polarization switched by a ferroelectric resonant tunneling diode", (Sep. 4, 2007), Applied Physics Letters 91, 103103.*
Li et al. In "Shifting intrinsic bistability states in a ferroelectric resonant tunneling diode", (Jun. 28, 2007), Physical Review B 75, 212106.*
Nammee Kim et al Manipulation of spin states by dipole polarization switching, Applied Physics Letters 91, 113504 (2007).

* cited by examiner

*Primary Examiner* — N Drew Richards
*Assistant Examiner* — Michael Jung
(74) *Attorney, Agent, or Firm* — Sughrue Mion, PLLC

(57) ABSTRACT

Disclosed herein is a structure and method for manipulating a spin state, regarded as important in the field of spintronics, by which the distribution of spin-up and spin-down states of carriers in a hybrid double quantum disk structure, composed of a diluted magnetic semiconductor and a ferroelectric compound semiconductor, is manipulated through dipole polarization switching of the ferroelectric compound semiconductor without a change in bias. Giant Zeeman splitting properties of the diluted magnetic semiconductor and polarization properties of the ferroelectric compound semiconductor are applied in conjunction with the Pauli exclusion principle, thus enabling the combination or separation of carriers in spin-up and spin-down states in the hybrid double quantum disk structure. The spin relaxation time in the structure is on the order of microseconds, during which the spin state is well-defined, and therefore, the structure can be applied to microprocessors having gigahertz clock speeds.

4 Claims, 3 Drawing Sheets

STRUCTURE AND METHOD FOR MANIPULATING SPIN QUANTUM STATE THROUGH DIPOLE POLARIZATION SWITCHING

CROSS-REFERENCE TO RELATED APPLICATION

This non-provisional application claims priority under U.S.C. §119 from Korean Patent Application No. 2007-97733, filed on Sep. 28, 2007, the entire contents of which are incorporated herein in their entirety by reference.

BACKGROUND

1. Field of the Invention

This disclosure is directed to a method of manipulating a spin state, and, more particularly, to a method of separating spin quantum states, in which, in a hybrid double quantum disk structure composed of a diluted magnetic semiconductor (DMS) and a ferroelectric compound semiconductor (FES), the polarization direction of the dipoles of the FES is switched.

2. Description of the Related Art

Although semiconductor integration techniques have advanced to the extent of enabling the integration of about five ten million transistors on one CPU (Central Processing Unit), computers having much higher capacity are still required in order to process tremendous quantities of information. However, it is impossible to continue to decrease the size of devices or the width of circuit lines in order to increase the degree of integration. Theoretically, lead wires having circuit line widths up to 4 nm are able to be realized, but, actually, even at a width of 16 nm, devices do not function due to excessive heat generation by tunneling or interference and leakage current.

Attributable to the above problems, limitations are imposed on techniques for continuously integrating devices based on binary bits. However, if the number of bits is increased, even with integration techniques at the current level, the capacity problem of devices is expected to be overcome. The method of increasing the number of bits includes the fabrication of multinary bit devices by using the spin degrees freedom of carriers (electrons or holes), which is called spintronics. One of the main requirements of spintronic nanodevices is to manipulate the spin state in a quantum structure on the nanometer scale.

DMS and FES materials, used for the structure and method according to the example embodiments, has been intensively studied due to their applicability to nonvolatile memory, piezoelectric actuators, sensors, and semiconductor spintronic devices, and furthermore, one-dimensional structures such as nanowires or nanorods have been recently studied successfully.

SUMMARY

Disclosed herein is a structure for improving the manipulation of a spin state using a hybrid quantum disk for use in spintronic devices.

Also disclosed herein is a method of manipulating the distribution of spin-up and spin-down states of carriers using the above structure.

In accordance with an aspect, a structure for manipulating a spin quantum state through dipole polarization switching is provided, which comprises a hybrid double quantum disk structure, which is provided in a semiconductor nanorod or nanowire, and is composed of a DMS disk, disposed in a predetermined portion of the upper region thereof, and an FES disk, disposed in a predetermined portion of the lower region thereof, the DMS disk and the FES disk being spaced apart from each other at a predetermined interval.

In accordance with another aspect, a method of manipulating a spin quantum state through dipole polarization switching using the above structure is provided, in which, when the dipole direction of the FES is changed at fixed bias voltage, a carrier in the spin-up state in the FES is transferred into the DMS, and when the dipole direction is restored, the carrier in the spin-up state is combined again into the FES disk.

BRIEF DESCRIPTION OF THE DRAWINGS

Example embodiments will be more clearly understood from the following detailed description, taken in conjunction with the accompanying drawings, in which.

DESCRIPTION OF THE PREFERRED EMBODIMENTS

Figure 1:
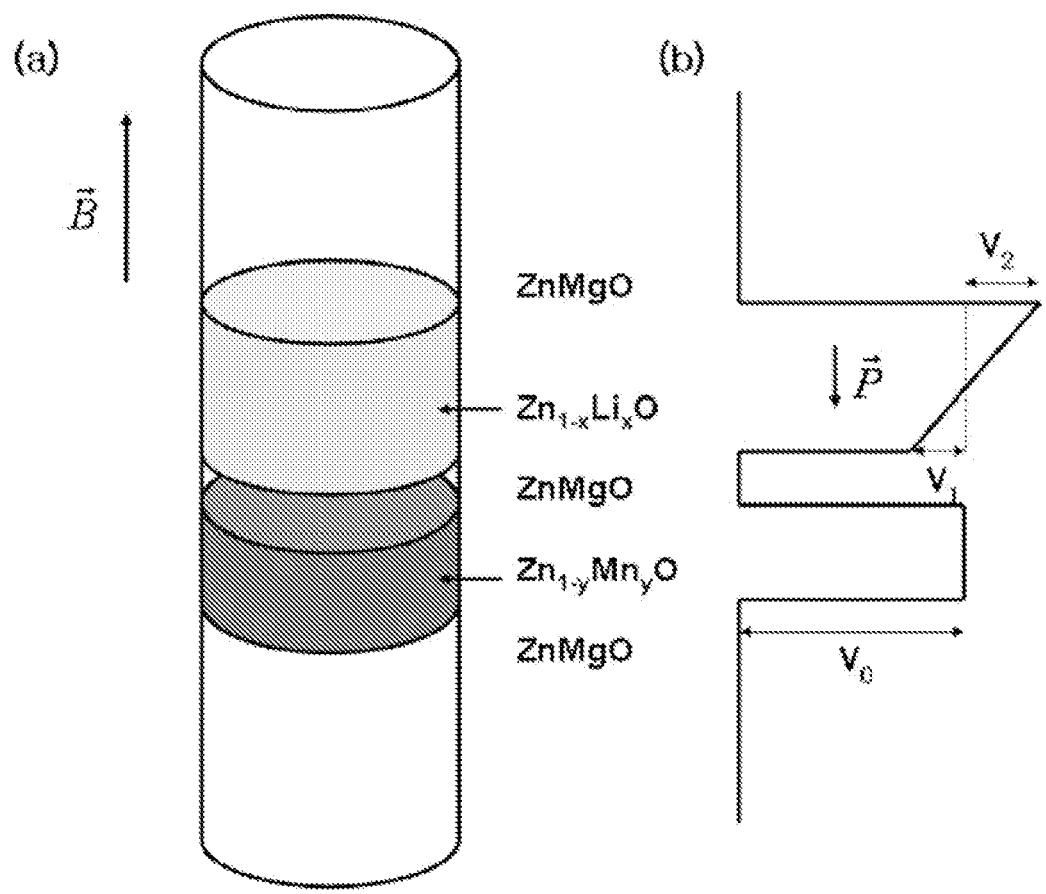
FIG. 1A shows an exemplary schematic view of a DMS/FES hybrid double quantum disk structure.
FIG. 1B shows a hole reverse potential of the DMS/FES hybrid double quantum disk structure in a z-axis direction, in which $V_1$ and $V_2$ are electrostatic potential quantities by surface charges formed at heterojunction surfaces.

Hereinafter, a detailed description will be given of example embodiments with reference to the accompanying drawings. Known functions and constructions related thereto are omitted to avoid ambiguity.

The terminology used herein is for the purpose of describing particular embodiments only and is not intended to be limiting of the invention. As used herein, the singular forms "a", "an" and "the" are intended to include the plural forms as well, unless the context clearly indicates otherwise. The use of the terms "first", "second", and the like do not imply any particular order but are included to identify individual elements. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the drawings, like reference numerals in the drawings denote like elements and the thicknesses of layers and regions are exaggerated for clarity.

In accordance with an embodiment, a structure for manipulating a spin quantum state through dipole polarization switching comprises a hybrid double quantum disk structure, which is provided in a semiconductor nanorod or nanowire, and is composed of a DMS disk, disposed in a predetermined portion of the upper region thereof, and an FES disk, disposed in a predetermined portion of the lower region thereof, the DMS disk and the FES disk being spaced apart from each other at a predetermined interval.

In the DMS/FES hybrid double quantum disk structure, the dipole polarization of the FES is controlled without the change in bias, thereby manipulating the distribution of spin-up and spin-down states of charges in the double disk.

The first electrostatic potential occurred in a heterojunction surface between one end of the FES and the semiconductor nanorod or nanowire, induced by a difference in surface charge density therebetween, and the second electrostatic potential occurred in another heterojunction surface between the other end of the FES and the semiconductor nanorod or nanowire, induced by a difference in surface charge density therebetween, may be different from each other.

In accordance with another embodiment, a method of manipulating a spin quantum state through dipole polarization switching using the above structure is provided, in which, when the dipole direction of the FES is changed at fixed bias voltage, the spin-up state of the FES is transferred into the DMS, and when the dipole direction is restored, the spin-up state is combined again into the FES disk.

The hybrid double quantum disk structure, which is devised as a spin control device, is illustrated in FIGS. 1A and 1B. FIG. 1A schematically shows the DMS/FES hybrid double quantum disk structure, and FIG. 1B shows the hole reverse potential of the DMS/FES hybrid double quantum disk structure in a z-axis direction. In this case, ZnMgO is doped with 20% Mg, and thus has $V_0 = -263$ meV. $V_1$ and $V_2$ are electrostatic potential quantities by surface charges formed at heterojunction surfaces. As seen in FIG. 1A, in the semiconductor nanorod (or nanowire), the hybrid double quantum disk structure is composed of the DMS disk, which is disposed in the predetermined portion of the upper region thereof, and the FES disk, which is disposed in the predetermined portion of the lower region thereof, in which the DMS disk and the FES disk are spaced apart from each other at a predetermined interval. The FES disk is formed to be wider than the DMS disk, so that the energy level of the FES is higher or lower than the energy level of the DMS through the dipole polarization of the FES.

The hybrid double quantum disk structure may be adopted as a spin manipulation device, regardless of the type of charge, that is, whether the DMS disk and the FES disk are a P type or an N type.

The DMS disk and the FES disk of the hybrid double quantum disk structure may be formed with a Group III-V or II-VI compound semiconductor.

Below, the example embodiments are described in detail, but are not construed to limit the scope thereof.

According to the example embodiments, the distribution of the spin-up and spin-down states of charges in the double disk may be manipulated only through the dipole polarization switching of the FES, without a change in bias. For numerical demonstration thereof, a description is given below based on ZnO. ZnO is known to exhibit DMS properties (Mn doping) and FES properties (Li doping) depending on the type of dopant. Further, ZnO is known as a material having a ferromagnetic transition temperature at room temperature or higher through doping of 5% Mn, and is thus useful in the fabrication of spin devices that may be driven at room temperature.

As illustrated in FIG. 1A, two ZnLiO and ZnMnO quantum disks are placed in the ZnMgO quantum wire. The upper ZnLiO is a P type FES and has spontaneous polarization (P), and the lower ZnMnO is a DMS. As seen in FIG. 1B, because the ZnLiO has different shielding ranges from those of ZnMgO, located on both sides thereof, the ZnLiO disk (FES disk), which is located in the upper portion of the structure, has a graded electrostatic potential at both heterojunction surfaces thereof due to difference in the surface charges of the heterojunction surfaces. The graded electrostatic potential plays a role in changing the energy level in the FES when the dipole direction is changed.

The structure and method for manipulating the spin quantum state through dipole polarization switching are characterized in that ZnMnO, corresponding to DMS, has giant Zeeman splitting properties, which are general DMS properties, whereas ZnLiO has relatively small Zeeman splitting properties, and the Pauli exclusion principle, related to spin properties, by which two identical spins cannot coexist in the same quantum state simultaneously, is used.

That is, when only the dipole direction of the FES is changed at fixed bias voltage, the lowest energy state is transferred from the FES disk to the DMS disk. Accordingly, the spin-up and spin-down states, which are present together in the FES, are separated into both disks. Conversely, when the dipole direction is restored, the separated spin states may be combined into the FES disk.

In order to calculate the energy level of the hybrid double quantum disk structure, to which a very weak magnetic field is applied, the structure of FIG. 1A is specified as effective Hamiltonian, represented by Equation 1 below.

$$H = \frac{(p - eA)^2}{2m^*} + g^* \mu_B B \sigma_z - eF_g z + V_e(r) + V_d(z) + V_{p-d} \qquad \text{Equation 1}$$

In Equation 1, the confinement potential is represented by Equation 2 below.

$$V_e(x, y) = \frac{1}{2} m^* (\omega_x^2 + \omega_y^2).$$

$$V_e(z) = \begin{cases} V_0 & \text{inside the disks} \\ 0 & \text{otherwise,} \end{cases} \qquad \text{Equation 2}$$

Hence, when the nanorod is realized by a two-dimensional parabolic potential, two disks are designed in the form of two wells, in which the depth of the well is V in the longitudinal direction of the nanorod. Further, the magnetic properties of the DMS disk are expressed by Equation 3 below.

$$V_{p-d} = J_{p-d}(S_z)J_z \approx -N_0 \beta y(S_z)\sigma_z \qquad \text{Equation 3}$$

The dipole potential of the FES disk is expressed by Equation 4 below.

$$V_d(z) = F_d(z - w_b/2) + (V_0 \pm V_1) \qquad \text{Equation 4}$$

In consideration of all of the above conditions, the energy level of the charges is calculated, and thus, the spin distribution of the charges may be calculated. The main constants of the structure used for the above calculation follow. The DMS disk has a thickness of 10 nm, the interval between two disks is 5 nm, and the FES disk has a thickness of 15 nm. ZnLiO is doped with 5% Li, and ZnMgO is doped with 20% Mg, and thereby, the potential depth of −263 meV is realized. The doping rate of Mn in ZnMnO is not independently revealed, but is determined with regard to the magnitude of the external magnetic field.

FIGS. 2A and 2B show the z-axis distribution of charges present in the occupied energy band and the changes in potential depending on dipole switching when the dipoles are directed leftward and rightward, respectively. The structure has a dimension in which the FES and DMS disks have thicknesses of 15 nm and 10 nm, respectively, and the wall therebetween has a thickness of 5 nm. As seen in the drawings, when the dipoles in the FES disk are directed leftward, the lowest energy of the spin-up and spin-down states in the structure according to the example embodiments is exclusively present in the FES disk. However, when the dipole direction of the FES disk is changed to the right under conditions in which the bias voltage is maintained at 0, the potential varies, and thus, the lowest energy level of the spin-up state is transferred to the DMS, so that the up-spins are shifted to the left DMS disk. However, because the DMS has giant Zeeman splitting properties, the lowest energy level of the spin-down state is still present in the FES disk, and is thus not shifted. So, two spin states are split into left and right disks.

Figure 2:
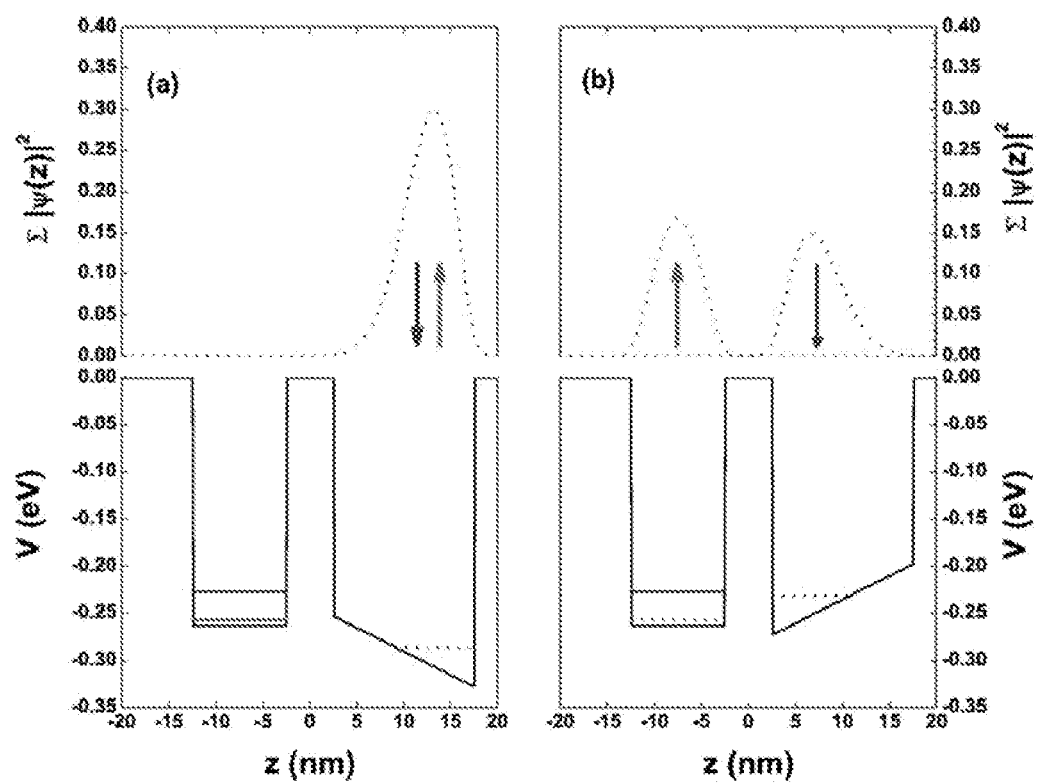
FIGS. 2A and 2B show the z-axis distribution of charges present in the occupied energy band and changes in potential depending on dipole polarization switching when dipoles are directed leftward and rightward, respectively.
Figure 3:
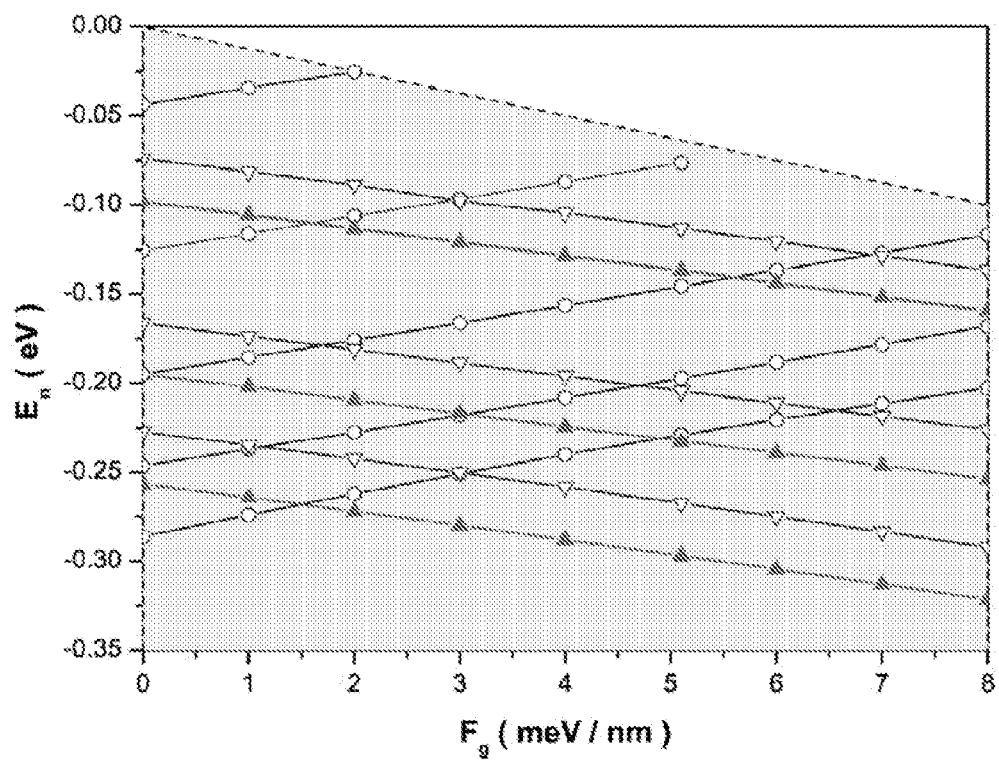
FIG. 3 shows the energy level of a hybrid double quantum disk structure when the dipole direction is set to the left, in which the dash line is a maximum value of the energy level confined in the disk, and the structure has the same dimension as that of FIG. 2.

FIG. 3 shows the energy level of the hybrid double quantum disk structure when the dipole direction is set to the left, in which the dash line is the maximum value of the energy level confined in the disk and the structure has the same dimension as that of FIG. 2. As is apparent from FIG. 3, showing the changes in energy level depending on the bias voltage, before the dipole direction is changed, specifically, when the spin-up state and the spin-down state are present together in the right FES disk, the bias voltage is increased under conditions in which the dipole direction is fixed, thereby inducing the lowest energy transfer phenomenon depending on the changes in potential, and sequentially shifting the spins from the FES disk to the right DMS disk. As seen in the drawing, when Fg (bias voltage) is smaller than 1.5 meV/nm, two spins are present in the FES disk. In the range between 1.5 meV/nm and 3 meV/nm, spins are split into both disks. At 3 meV/nm or higher, all of the spins are shifted to the DMS disk.

That is, according to the embodiment, the spins are manipulated through the changes in dipole direction at fixed bias, or alternatively, are manipulated through the changes in bias under conditions in which the dipole direction is fixed.

As described hereinbefore, giant Zeeman splitting properties of a DMS and polarization properties of an FES are used in conjunction with the Pauli exclusion principle, and thus, in a hybrid double quantum disk structure, it is possible to combine or separate spin-up and spin-down states.

The spin relaxation time of the structure is on the order of microseconds, during which the spin state is well-defined, and therefore, the structure can be applied to microprocessors having gigahertz clock speeds.

Although example embodiments have been disclosed for illustrative purposes, those skilled in the art will appreciate that various modifications, additions and substitutions are possible, without departing from the scope and spirit of the invention as disclosed in the accompanying claims.

What is claimed is:

1. A method of manipulating a spin quantum state through dipole polarization switching using a structure comprising a hybrid double quantum disk structure, which is provided in a semiconductor nanorod or nanowire and is composed of a diluted magnetic semiconductor disk disposed in a predetermined portion of one side region thereof and a ferroelectric compound semiconductor disk disposed in a predetermined portion of the other side region thereof, the diluted magnetic semiconductor disk and the ferroelectric compound semiconductor disk being spaced apart from each other at a predetermined interval, said method comprising:
   changing a dipole direction of the ferroelectric compound semiconductor at fixed bias voltage to transfer a spin-up state of the ferroelectric compound semiconductor into a diluted magnetic semiconductor;
   restoring the dipole direction, to combine the spin-up state again into the ferroelectric compound semiconductor disk; and
   controlling spin separation by reversing dipole polarization of the ferroelectric compound semiconductor disk, but without bias voltage.

2. The method of claim 1, wherein the diluted magnetic semiconductor disk and the ferroelectric compound semiconductor disk are either a P type or an N type.

3. The method of claim 1, wherein the nanorod or nanowire, the diluted magnetic semiconductor disk, and the ferroelectric compound semiconductor disk comprise any one selected from among Group III-V and II-VI compound semiconductors.

4. The method of claim 1, wherein a first electrostatic potential in a heterojunction surface between one end of the ferroelectric compound semiconductor and the semiconductor nanorod or nanowire, induced by a difference in surface charge density therebetween, and a second electrostatic potential in another heterojunction surface between the other end of the ferroelectric compound semiconductor and the semiconductor nanorod or nanowire, induced by a difference in surface charge density therebetween, are different from each other.

* * * * *